(12) United States Patent
Yasuda

(10) Patent No.: US 11,074,948 B2
(45) Date of Patent: Jul. 27, 2021

(54) SEMICONDUCTOR DEVICE AND MEMORY SYSTEM

(71) Applicant: TOSHIBA MEMORY CORPORATION, Minato-ku (JP)

(72) Inventor: Yohei Yasuda, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/929,857

(22) Filed: Jul. 15, 2020

(65) Prior Publication Data
US 2020/0349989 A1 Nov. 5, 2020

Related U.S. Application Data

(62) Division of application No. 16/299,578, filed on Mar. 12, 2019, now Pat. No. 10,762,937.

(30) Foreign Application Priority Data

Jul. 27, 2018 (JP) .............................. JP2018-141627

(51) Int. Cl.
*G11C 7/22* (2006.01)
*H03K 3/356* (2006.01)
(Continued)

(52) U.S. Cl.
CPC ....... *G11C 7/222* (2013.01); *H03K 3/356104* (2013.01); *H03K 5/1565* (2013.01);
(Continued)

(58) Field of Classification Search
CPC .. G11C 7/222; G11C 7/225; H03K 3/356104; H03K 5/1565; H03K 19/00; H03K 19/003; H03K 19/0139
See application file for complete search history.

(56) References Cited

U.S. PATENT DOCUMENTS 7,642,828 B2 1/2010 Sakai
7,969,213 B2 6/2011 Kim
(Continued)

FOREIGN PATENT DOCUMENTS

JP 2000-305528 11/2000
JP 2002-190196 7/2002
(Continued)

*Primary Examiner* — Vanthu T Nguyen
(74) *Attorney, Agent, or Firm* — Oblon, McClelland, Maier & Neustadt, L.L.P.

(57) ABSTRACT

According to one embodiment, in a semiconductor device, the first pull-up circuit is connected to a third node and to a fourth node. The third node is a node between a drain of the first transistor with a first conductivity type and a source of the second transistor with the first conductivity type. The fourth node is a node between a drain of the third transistor with the first conductivity type, and a source of the fourth transistor with the first conductivity type and a source of the fifth transistor with the first conductivity type. The first pull-down circuit is connected to a fifth node and to a sixth node. The fifth node is a node between a drain of the first transistor with a second conductivity type and a source of the second transistor with the second conductivity type. The sixth node is a node between a drain of the third transistor with the second conductivity type and a source of the fourth transistor with the second conductivity type and a source of the fifth transistor with the second conductivity type.

5 Claims, 10 Drawing Sheets

(51) Int. Cl.
*H03K 5/156* (2006.01)
*H03K 19/003* (2006.01)
*H03K 19/00* (2006.01)
*H03K 19/013* (2006.01)

(52) U.S. Cl.
CPC .......... *H03K 19/00* (2013.01); *H03K 19/003* (2013.01); *H03K 19/0136* (2013.01)

(56) References Cited

U.S. PATENT DOCUMENTS

| | | |
|---|---|---|
| 8,730,757 B2 | 5/2014 | Shimizu |
| 8,879,335 B2 | 11/2014 | Koyanagi et al. |
| 9,793,884 B2 | 10/2017 | Ma |
| 2011/0050304 A1 | 3/2011 | Kuroki |

FOREIGN PATENT DOCUMENTS

| | | |
|---|---|---|
| JP | 2007-329924 | 12/2007 |
| JP | 2013-200830 | 10/2013 |
| JP | 5566941 | 8/2014 |

SEMICONDUCTOR DEVICE AND MEMORY SYSTEM

CROSS-REFERENCE TO RELATED APPLICATIONS

This application is a division of U.S. application Ser. No. 16/299,578, filed Mar. 12, 2019, which is based upon and claims the benefit of priority from Japanese Patent Application No. 2018-141627, filed on Jul. 27, 2018; the entire contents of each of which are incorporated herein by reference.

FIELD

Embodiments described herein relate generally to a semiconductor device and a memory system.

BACKGROUND

A semiconductor device used for an interface of a semiconductor memory externally receives a reference differential clock, adjusts the reference differential clock to generate an internal differential clock, and supplies the internal differential clock to the semiconductor memory. The semiconductor memory can latch data with the internal differential clock. At this time, it is desirable to properly generate the internal differential clock.

DETAILED DESCRIPTION

Figure 1:
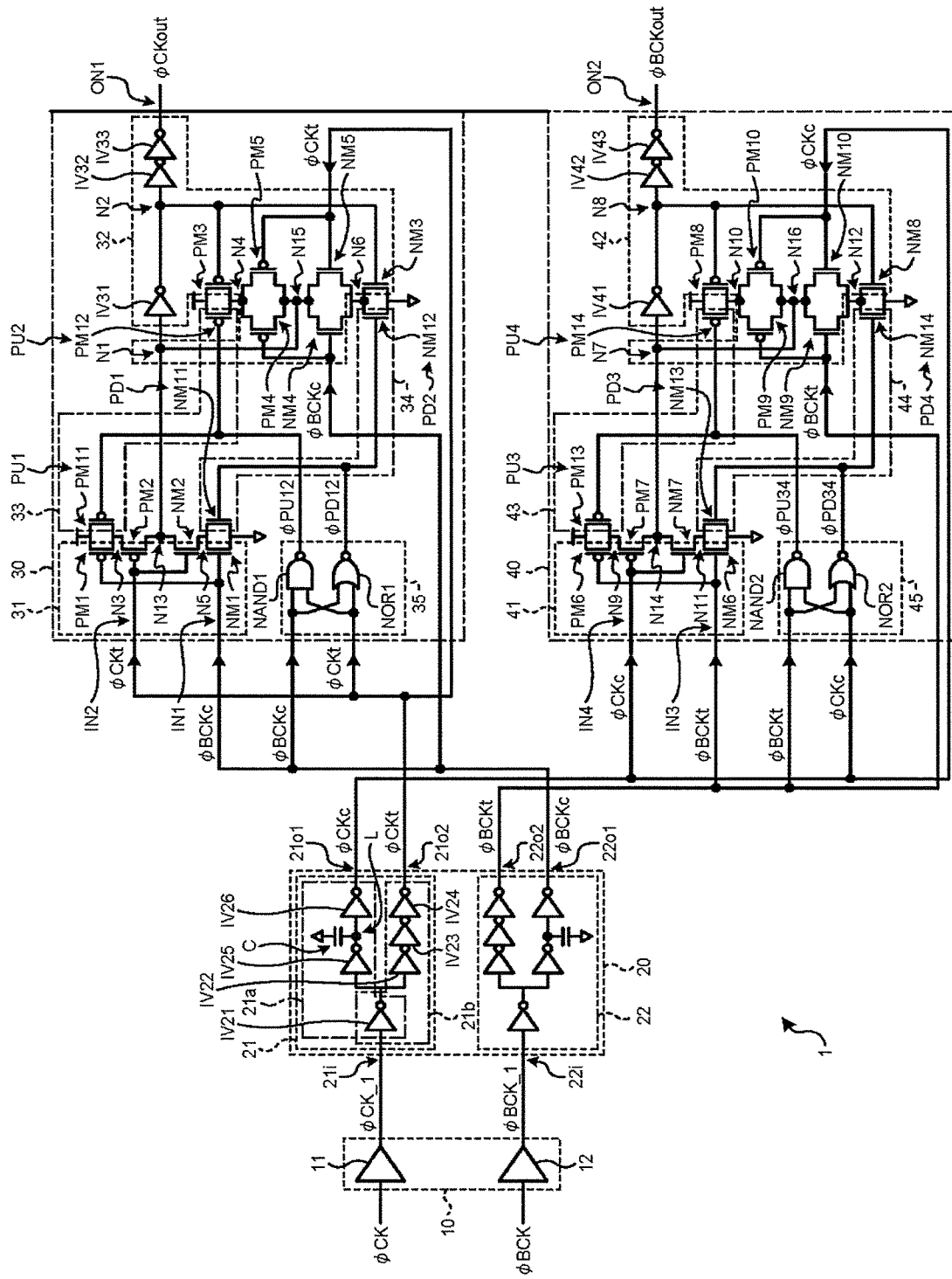
FIG. 1 is a circuit diagram illustrating a configuration of a semiconductor device according to a first embodiment.

In general, according to one embodiment, there is provided a semiconductor device including a first input circuit, a first latch circuit, a first pull-up circuit, and a first pull-down circuit. In the first input circuit, a second transistor with a first conductivity type and a second transistor with a second conductivity type are arranged between a first transistor with the first conductivity type and a first transistor with the second conductivity type. The second transistor with the first conductivity type and the second transistor with the second conductivity type have gates commonly connected to a second input node. The first transistor with the first conductivity type and the first transistor with the second conductivity type have gates commonly connected to a first input node. In the first latch circuit, a connection of a fourth transistor with the first conductivity type and a fourth transistor with the second conductivity type and a connection of a fifth transistor with the first conductivity type and a fifth transistor with the second conductivity type are arranged in parallel between a third transistor with the first conductivity type and a third transistor with the second conductivity type. The fourth transistor with the first conductivity type and the fourth transistor with the second conductivity type have gates commonly connected to the first input node and have drains commonly connected to a first node. The fifth transistor with the first conductivity type and the fifth transistor with the second conductivity type have gates commonly connected to the second input node and have drains commonly connected to the first node. The third transistor with the first conductivity type and the third transistor with the second conductivity type have gates commonly connected to a second node connected to the first node on an output side of the first input circuit via a first inverter. The first pull-up circuit is connected to a third node and to a fourth node. The third node is a node between a drain of the first transistor with the first conductivity type and a source of the second transistor with the first conductivity type in the first input circuit. The fourth node is a node between a drain of the third transistor with the first conductivity type, and a source of the fourth transistor with the first conductivity type and a source of the fifth transistor with the first conductivity type in the first latch circuit. The first pull-down circuit is connected to a fifth node and to a sixth node. The fifth node is a node between a drain of the first transistor with the second conductivity type and a source of the second transistor with the second conductivity type in the first input circuit. The sixth node is a node between a drain of the third transistor with the second conductivity type and a source of the fourth transistor with the second conductivity type and a source of the fifth transistor with the second conductivity type in the first latch circuit.

Exemplary embodiments of a semiconductor device will be explained below in detail with reference to the accompanying drawings. The present invention is not limited to the following embodiments.

First Embodiment

A semiconductor device according to a first embodiment can be used for a high-speed interface of a semiconductor memory. The semiconductor device is configured according to standards such as DDR, DDR2, DDR3, low power double-data-rate (LPDDR), LPDDR2, and open NAND flash interface (ONFI) in consideration of high-speed data transfer. According to the standards such as DDR, data fetch at double edges of rising and falling of a clock can realize double transfer speed (double data rate) as compared with data fetch at only rising or falling of a clock.

The semiconductor device receives a reference differential clock from an outside, adjusts the reference differential clock to generate an internal differential clock, and supplies the internal differential clock to the semiconductor memory. The semiconductor memory may be a nonvolatile memory such as a NAND-type flash memory or a volatile memory such as a synchronous dynamic random access memory (SDRAM).

In the semiconductor device and/or the semiconductor memory, an operation such as data latch is performed in synchronization with a cross point of the internal differential clock. Since an allowable duty cycle distortion (DCD) range becomes narrower as a frequency of the differential clock used for this operation increases, suppression of DCD is desired.

The semiconductor device may be configured using a duty cycle corrector (DCC) in order to perform duty correction to suppress the DCD of the differential clock. In this case, not only circuit scale and power consumption become large but also a warm-up cycle for training before operation is provided, and it becomes difficult to satisfy a demand of operating from the first clock of the standard.

Meanwhile, the semiconductor device may be configured using a cross point correction circuit in order to correct the cross point of the differential clock to an appropriate level (for example, an intermediate level between an Logical low level and an Logical high level). The cross point correction circuit applies, to the differential clocks, correction to generate a clock shifted at timing when logic levels of a clock corresponding to one of the differential clocks and of a clock obtained by logically inverting the other differential clock become uniform, to set the cross point to an appropriate level (for example, near the intermediate level). With the correction, if the cross points of the differential clocks can be arranged at substantially temporally equal intervals, correction of DCD without the warm up cycle is conceivable.

However, in the cross point correction circuit, a delay occurs at edge timing of a first differential clock and a first cross point deviates from the appropriate level and an eye pattern becomes small in some cases. That is, there is a possibility that erroneous data values may be latched in the semiconductor device and/or the semiconductor memory due to insufficient setup time and hold time in the data latch with respect to the first differential clock.

This is believed to be due to the fact that an intermediate node in the cross point correction circuit becomes in a floating state and a period in which a potential of the intermediate node becomes unstable exists. For example, if a state in which no clock is input continues, the intermediate node tends to float, and the potential can become an intermediate potential between the Logical high level and the Logical low level due to a leakage current. When a clock is input in this state, an internal state changes between a time when the first clock is received and a time when the second clock is received, and thus response speeds have a difference. There is a possibility that this difference causes jitter and presses a high-speed operation margin.

Therefore, in the first embodiment, pull-up circuits capable of pulling up an intermediate node on a power supply side and pull-down circuit capable of pulling down an intermediate node on a ground side are provided, thereby to properly generate a first differential clock in a cross point correction circuit of a semiconductor device.

Specifically, a semiconductor device 1 can be configured as illustrated in FIG. 1. FIG. 1 is a circuit diagram illustrating a configuration of the semiconductor device 1. The semiconductor device 1 includes a receiver 10, a phase splitter 20, a cross point correction circuit 30, and a cross point correction circuit 40.

The semiconductor device 1 receives reference differential clocks ($\varphi$CK and $\varphi$BCK) from an outside (for example, a host or a signal processing circuit). The reference differential clocks include a reference non-inverted clock $\varphi$CK and a reference inverted clock $\varphi$BCK. Correspondingly, the receiver 10 and the phase splitter 20 are each configured with differential input and output. The cross point correction circuit 30 and the cross point correction circuit 40 constitute a differential pair. The cross point correction circuit 30 is a non-inverting-side cross point correction circuit, and the cross point correction circuit 40 is an inverting-side cross point correction circuit.

The receiver 10 is arranged on an input side of the phase splitter 20. The receiver 10 includes a non-inverting-side receiver 11 and an inverting-side receiver 12. The receiver 11 receives the reference non-inverted clock $\varphi$CK, generates a non-inverted clock $\varphi$CK_1, and supplies the non-inverted clock $\varphi$CK_1 to the phase splitter 20. The receiver 12 receives the reference inverted clock $\varphi$BCK, generates an inverted clock $\varphi$BCK_1, and supplies the inverted clock $\varphi$BCK_1 to the phase splitter 20.

Figure 2:
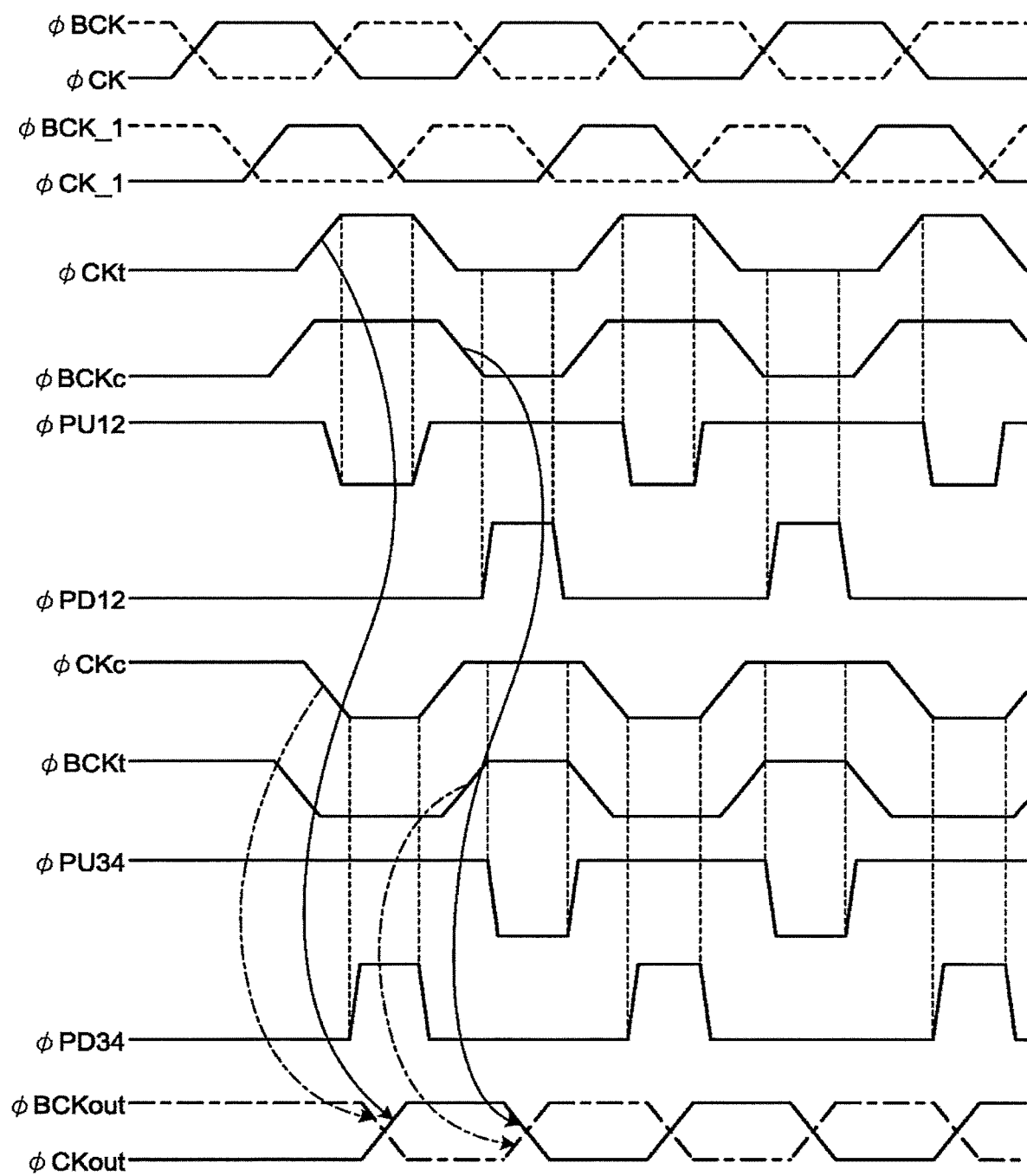
FIG. 2 is a waveform diagram illustrating an operation of the semiconductor device according to the first embodiment.

For example, as illustrated in FIG. 2, the receiver 10 receives the differential clocks ($\varphi$CK and $\varphi$BCK) each having a duty ratio of approximately 50% and a cross point close at near an appropriate level (for example, an intermediate level). FIG. 2 is a waveform diagram illustrating an operation of the semiconductor device. Meanwhile, in the non-inverted clock $\varphi$CK_1 and the inverted clock $\varphi$BCK_1 output from the receiver 10, the duty ratios deviate from 50%, respectively, and the cross point can deviate from the appropriate level due to asymmetry of characteristics between the non-inverting-side receiver 11 and the inverting-side receiver 12.

The phase splitter 20 illustrated in FIG. 1 is arranged between the receiver 10, and the cross point correction circuit 30 and the cross point correction circuit 40. The phase splitter 20 has a non-inverting-side phase splitter 21 and an inverting-side phase splitter 22.

The non-inverting-side phase splitter 21 receives the non-inverted clock $\varphi$CK_1 via a node 21$i$, and generates and outputs a clock $\varphi$CKc, which is obtained by logically inverting the non-inverted clock $\varphi$CK_1, and a clock $\varphi$CKt corresponding to the non-inverted clock $\varphi$CK_1.

The phase splitter 21 includes, for example, a chain circuit 21$a$ and a chain circuit 21$b$. The chain circuit 21$a$ has a configuration in which an inverter IV21, an inverter IV25, and an inverter IV26 are sequentially connected in series in a chain manner, and one end of a capacitive element C is connected to a line L connecting the inverter IV25 and the inverter IV26. The other end of the capacitive element C can be connected to a ground potential. As a result, the chain circuit 21$a$ passes the non-inverted clock $\varphi$CK_1 through the inverters IV21, IV25 and IV26 of the odd number stage to generate and output the clock $\varphi$CKc. The chain circuit 21$b$ has a configuration in which the inverter IV21, an inverter IV22, an inverter IV23, and an inverter IV24 are sequentially connected in series in a chain manner. As a result, the chain circuit 21$b$ passes the non-inverted clock $\varphi$CK_1 through the inverters IV21 to IV44 of the even number stage to generate and output the clock $\varphi$CKt.

The inverting-side phase splitter 22 receives the inverted clock $\varphi$BCK_1 via the node 21$i$, and generates and outputs a clock $\varphi$BCKc, which is obtained by logically inverting the inverted clock $\varphi$BCK_1, and a clock $\varphi$BCKt corresponding to the inverted clock $\varphi$BCK_1. The internal configuration of the inverting-side phase splitter 22 is similar to the internal configuration of the non-inverting-side phase splitter 21.

The phase splitter 20 supplies the clock φCKt from a node 21o2 to the cross point correction circuit 30 and the clock φBCKc from a node 22o1 to the cross point correction circuit 30.

For example, as illustrated in FIG. 2, in a case where the duty ratios of the non-inverted clock φCK_1 and the inverted clock φBCK_1 deviate from 50%, respectively, the duty ratios of the clock φCKt and the clock φBCKc can deviate from 50%, respectively.

The cross point correction circuit 30 illustrated in FIG. 1 generates a clock φCKout shifted at timing when logic levels of the clock φCKt corresponding to the non-inverted clock φCK_1 and of the clock φBCKc obtained by logically inverting the inverted clock φBCK_1 become uniform. The clock φCKt is a clock corresponding to the clock φCK, and the clock φBCKc is a clock corresponding to the clock φBCK. Accordingly, the cross point correction circuit 30 equivalently applies correction to the differential clocks (the pair of clocks φCK and φBCK) so that the cross point becomes the appropriate level (for example, near the intermediate level).

The cross point correction circuit 30 is arranged on an output side of the phase splitter 20. The cross point correction circuit 30 includes an input circuit 31, a latch circuit 32, a pull-up circuit 33, a pull-down circuit 34, and a control circuit 35. The input circuit 31 is arranged on a phase splitter 20 side in the cross point correction circuit 30. The latch circuit 32 is arranged on an output side of the input circuit 31. The pull-up circuit 33 and the pull-down circuit 34 are arranged between the input circuit 31 and the latch circuit 32. The control circuit 35 is arranged on input sides of the pull-up circuit 33 and the pull-down circuit 34.

The input circuit 31 has a PMOS transistor PM2 and an NMOS transistor NM2 arranged between a PMOS transistor PM1 and an NMOS transistor NM1.

The PMOS transistor PM1 and the NMOS transistor NM1 have gates commonly connected to an input node IN1. The PMOS transistor PM1 has a source connected to a power supply potential and a drain connected to a node N3. The NMOS transistor NM1 has a source connected to the ground potential and a drain connected to a node N5.

The PMOS transistor PM2 and the NMOS transistor NM2 have gates commonly connected to an input node IN2. The PMOS transistor PM2 has a source connected to the node N3 and a drain connected to a node N13. The NMOS transistor NM2 has a source connected to the node N5 and a drain connected to the node N13. The node N13 constitutes an output node of the input circuit 31.

With the configuration, the input circuit 31 outputs, according to the fact that a logic level of the clock φCKt and a logic level of the clock φBCKc have become uniform, a logic level obtained by inverting the uniform logic level to the node N13.

The latch circuit 32 has a PMOS transistor PM4 and an NMOS transistor NM4, and a PMOS transistor PM5 and an NMOS transistor NM5 arranged in parallel between a PMOS transistor PM3 and an NMOS transistor NM3.

The PMOS transistor PM3 and the NMOS transistor NM3 have gates commonly connected to a node N2. A node N1 on the output side of the input circuit 31 is connected to the node N2 via an inverter IV31. The node N1 is connected to node N13. The PMOS transistor PM3 has a source connected to the power supply potential and a drain connected to a node N4. The NMOS transistor NM3 has a source connected to the ground potential and a drain connected to a node N6.

The PMOS transistor PM4 and the NMOS transistor NM4 have gates commonly connected to the input node IN1 and drains commonly connected to the node N1 via a node N15. The PMOS transistor PM4 has a source connected to the node N4. The NMOS transistor NM4 has a source connected to the node N6.

The PMOS transistor PM5 and the NMOS transistor NM5 have gates commonly connected to the input node IN2 and drains commonly connected to the node N1 via the node N15. The PMOS transistor PM5 has a source connected to the node N4. The NMOS transistor NM5 has a source connected to the node N6.

The node N2 is connected to an output node ON1 via inverters IV32 and IV33. The output node ON1 functions as a non-inverting-side output node of the semiconductor device 1.

With the configuration, the latch circuit 32 outputs the logic level output from the input circuit 31 during a period in which the logic level of the clock φCKt and the logic level of the clock φBCKc are uniform, and holds and outputs the logic level that has been output immediately before, during a period in which the logic level of the clock φCKt and the logic level of the clock φBCKc are different.

The pull-up circuit 33 is connected to the node N3 and the node N4. The pull-up circuit 33 can pull up the node N3 and the node N4. The pull-up circuit 33 includes a pull-up switch PU1 and a pull-up switch PU2.

The pull-up switch PU1 is electrically inserted between the power supply potential and the node N3. The pull-up switch PU1 pulls up the node N3 in response to a control signal φPU12 received from the control circuit 35. The pull-up switch PU1 includes a PMOS transistor PM11. The PMOS transistor PM11 has a gate connected to the control circuit 35, a source connected to the power supply potential, and a drain connected to the node N3.

The pull-up switch PU2 pulls up the node N4 in response to the control signal φPU12 received from the control circuit 35. The pull-up switch PU2 is electrically inserted between the power supply potential and the node N4. The pull-up switch PU2 includes a PMOS transistor PM12. The PMOS transistor PM12 has a gate connected to the control circuit 35, a source connected to the power supply potential, and a drain connected to the node N4.

The pull-down circuit 34 is connected to the node N5 and the node N6. The pull-down circuit 34 can pull down the node N5 and the node N6. The pull-down circuit 34 includes a pull-down switch PD1 and a pull-down switch PD2.

The pull-down switch PD1 pulls down the node N5 in response to a control signal φPD12 received from the control circuit 35. The pull-down switch PD1 is electrically inserted between the ground potential and the node N5. The pull-down switch PD1 includes an NMOS transistor NM11. The NMOS transistor NM11 has a gate connected to the control circuit 35, a source connected to the ground potential, and a drain connected to the node N5.

The pull-down switch PD2 pulls down the node N6 in response to the control signal φPD12 received from the control circuit 35. The pull-down switch PD2 is electrically inserted between the ground potential and the node N6. The pull-down switch PD2 has an NMOS transistor NM12. The NMOS transistor NM12 has a gate connected to the control circuit 35, a source connected to the ground potential, and a drain connected to the node N6.

In the cross point correction circuit 30, the input circuit 31 receives the clock φCKt and the clock φBCKc, and at timing when the logic level of the clock φCKt and the logic level of the clock φBCKc have become uniform, the input circuit 31 outputs a signal obtained by inverting the logic level.

The control circuit 35 receives the clock φCKt and the clock φBCKc, and controls the pull-up circuit 33 and the pull-down circuit 34 according to the logic levels of the clock φCKt and the clock φBCKc. The control circuit 35 generates and supplies the control signal φPU12 to the pull-up switches PU1 and PU2 and generates and supplies the control signal φPD12 to the pull-down switches PD1 and PD2 in response to the clock φCKt and the clock φBCKc. The control circuit 35 has a NAND circuit NAND1 and a NOR circuit NOR1.

The NAND circuit NAND1 performs NAND operation of the clock φCKt and the clock φBCKc to generate the control signal φPU12, and supplies the control signal φPU12 to the pull-up switches PU1 and PU2. The control signal φPU12 is a low active signal. The NAND circuit NAND1 maintains the control signal φPU12 at an Logical low level (active level) during a period in which both the clock φCKt and the clock φBCKc are at an Logical high level (nonactive level), and maintains the control signal φPU12 at the Logical high level during a period in which at least one of the clock φCKt and the clock φBCKc is at the Logical low level.

The NOR circuit NOR1 generates and supplies the control signal φPD12 to the pull-down switches PD1 and PD2 in response to the clock φCKt and the clock φBCKc. The control signal φPD12 is a high active signal. The NOR circuit NOR1 maintains the control signal φPD12 at the Logical high level (active level) during a period in which both the clock φCKt and the clock φBCKc are at the Logical low level (nonactive level), and maintains the control signal φPD12 at the Logical low level during a period in which at least one of the clock φCKt and the clock φBCKc is at the Logical high level.

That is, the control circuit 35 can turn on/off the pull-up operation of the pull-up circuit 33 and turns on/off the pull-down operation of the pull-down circuit 34 according to the clock φCKt and the clock φBCKc, and can realize the pull-up operation and the pull-down operation while preventing a through current in the input circuit 31 and/or the latch circuit 32.

For example, as illustrated in FIG. 2, the control signal φPU12 becomes at the Logical low level (active level) and both the pull-up switches PU1 and PU2 are turned on in response to the fact that the output of the input circuit 31 becomes at the Logical low level at the timing when both the clock φCKt and the clock φBCKc become at the Logical high level. As a result, since the node N3 and the node N4 are pulled up, the waveform of the clock φCKout can be steeply raised and output from the output node ON1.

The cross point correction circuit 40 illustrated in FIG. 1 generates a clock φBCKout shifted at timing when logic levels of the clock φCKc corresponding to the non-inverted clock φCK_1 and of the clock φBCKt obtained by logically inverting the inverted clock φBCK_1 become uniform. The clock φCKc is a clock corresponding to the clock φCK, and the clock φBCKt is a clock corresponding to the clock φBCK. Accordingly, the cross point correction circuit 40 equivalently applies correction to the differential clocks (the pair of clocks φCK and φBCK) so that the cross point becomes the appropriate level (for example, near the intermediate level).

The cross point correction circuit 40 is arranged on the output side of the phase splitter 20. The cross point correction circuit 40 includes an input circuit 41, a latch circuit 42, a pull-up circuit 43, a pull-down circuit 44, and a control circuit 45. The input circuit 41 is arranged on the phase splitter 20 side in the cross point correction circuit 40. The latch circuit 42 is arranged on an output side of the input circuit 41. The pull-up circuit 43 and the pull-down circuit 44 are arranged between the input circuit 41 and the latch circuit 42. The control circuit 45 is arranged on input sides of the pull-up circuit 43 and the pull-down circuit 44.

The input circuit 41 has a PMOS transistor PM7 and an NMOS transistor NM7 between a PMOS transistor PM6 and an NMOS transistor NM6.

The PMOS transistor PM6 and the NMOS transistor NM6 have gates commonly connected to an input node IN3. The PMOS transistor PM6 has a source connected to the power supply potential and a drain connected to a node N9. The NMOS transistor NM6 has a source connected to the ground potential and a drain connected to a node N11.

The PMOS transistor PM7 and the NMOS transistor NM7 have gates commonly connected to an input node IN4. The PMOS transistor PM7 has a source connected to the node N9 and a drain connected to a node N14. The NMOS transistor NM7 has a source connected to the node N11 and a drain connected to the node N14. The node N14 constitutes an output node of the input circuit 41.

With the configuration, the input circuit 41 outputs, according to the fact that a logic level of the clock φCKc and a logic level of the clock φBCKt have become uniform, a logic level obtained by inverting the uniform logic level to the node N14.

The latch circuit 42 has a PMOS transistor PM9 and an NMOS transistor NM9, and a PMOS transistor PM10 and an NMOS transistor NM10 arranged in parallel between a PMOS transistor PM8 and an NMOS transistor NM8.

The PMOS transistor PM8 and the NMOS transistor NM8 have gates commonly connected to a node N8. A node N7 on the output side of the input circuit 41 is connected to the node N8 via an inverter IV41. The node N7 is connected to the node N14. The PMOS transistor PM8 has a source connected to the power supply potential and a drain connected to a node N10. The NMOS transistor NM8 has a source connected to the ground potential and a drain connected to a node N12.

The PMOS transistor PM9 and the NMOS transistor NM9 have gates commonly connected to the input node IN3 and drains commonly connected to the node N7 via a node N16. The PMOS transistor PM9 has a source connected to the node N10. The NMOS transistor NM9 has a source connected to the node N12.

The PMOS transistor PM10 and the NMOS transistor NM10 have gates commonly connected to the input node IN4 and drains commonly connected to the node N7 via the node N16. The PMOS transistor PM10 has a source connected to the node N10. The NMOS transistor NM10 has a source connected to the node N12.

The node N8 is connected to an output node ON2 via inverters IV42 and IV43. The output node ON2 functions as an inverting-side output node of the semiconductor device 1.

With the configuration, the latch circuit 42 outputs the logic level output from the input circuit 41 during a period in which the logic level of the clock φCKc and the logic level of the clock φBCKt are uniform, and holds and outputs the logic level that has been output immediately before, during a period in which the logic level of the clock φCKc and the logic level of the clock φBCKt are different.

The pull-up circuit 43 is connected to the node N9 and the node N10. The pull-up circuit 43 can pull up the node N9 and the node N10. The pull-up circuit 43 includes a pull-up switch PU3 and a pull-up switch PU4.

The pull-up switch PU3 is electrically inserted between the power supply potential and the node N9. The pull-up switch PU3 pulls up the node N9 in response to a control signal φPU34 received from the control circuit 45. The pull-up switch PU3 includes a PMOS transistor PM13. The PMOS transistor PM13 has a gate connected to the control circuit 45, a source connected to the power supply potential, and a drain connected to the node N9.

The pull-up switch PU4 pulls up the node N10 in response to the control signal φPU34 received from the control circuit 45. The pull-up switch PU4 is electrically inserted between the power supply potential and the node N10. The pull-up switch PU4 includes a PMOS transistor PM14. The PMOS transistor PM14 has a gate connected to the control circuit 45, a source connected to the power supply potential, and a drain connected to the node N10.

The pull-down circuit 44 is connected to the node N11 and the node N12. The pull-down circuit 44 can pull down the node N11 and the node N12. The pull-down circuit 44 includes a pull-down switch PD3 and a pull-down switch PD4.

The pull-down switch PD3 pulls down the node N11 in response to a control signal φPD34 received from the control circuit 45. The pull-down switch PD3 is electrically inserted between the ground potential and the node N11. The pull-down switch PD3 includes an NMOS transistor NM13. The NMOS transistor NM13 has a gate connected to the control circuit 45, a source connected to the ground potential, and a drain connected to the node N11.

The pull-down switch PD4 pulls down the node N12 in response to a control signal φPD34 received from the control circuit 45. The pull-down switch PD4 is electrically inserted between the ground potential and the node N12. The pull-down switch PD4 includes an NMOS transistor NM14. The NMOS transistor NM14 has a gate connected to the control circuit 45, a source connected to the ground potential, and a drain connected to the node N12.

In the cross point correction circuit 40, the input circuit 41 receives the clock φCKc and the clock φBCKt, and at timing when the logic level of the clock φCKc and the logic level of the clock φBCKt have become uniform, the input circuit 41 outputs a signal obtained by inverting the logic level.

The control circuit 45 receives the clock φCKc and the clock φBCKt, and controls the pull-up circuit 43 and the pull-down circuit 44 according to the logic levels of the clock φCKc and the clock φBCKt. The control circuit 45 generates and supplies the control signal φPU34 to the pull-up switches PU3 and PU4 and generates and supplies the control signal φPD34 to the pull-down switches PD3 and PD4 in response to the clock φCKc and the clock φBCKt. The control circuit 45 has a NAND circuit NAND2 and a NOR circuit NOR2.

The NAND circuit NAND2 performs NAND operation of the clock φCKc and the clock φBCKt to generate the control signal φPU34, and supplies the control signal φPU34 to the pull-up switches PU3 and PU4. The control signal φPU34 is a low active signal. The NAND circuit NAND2 maintains the control signal φPU34 at the Logical low level (active level) during a period in which both the clock φCKc and the clock φBCKt are at the Logical high level (nonactive level), and maintains the control signal φPU34 at the Logical high level during a period in which at least one of the clock φCKc and the clock φBCKt is at the Logical low level.

The NOR circuit NOR2 generates and supplies the control signal φPD34 to the pull-down switches PD3 and PD4 in response to the clock φCKc and the clock φBCKt. The control signal φPD34 is a high active signal. The NOR circuit NOR2 maintains the control signal φPD34 at the Logical high level (active level) during a period in which both the clock φCKc and the clock φBCKt are at the Logical low level (nonactive level), and maintains the control signal φPD34 at the Logical low level during a period in which at least one of the clock φCKc and the clock φBCKt is at the Logical high level.

That is, the control circuit 45 can turn on/off the pull-up operation of the pull-up circuit 43 and turns on/off the pull-down operation of the pull-down circuit 44 according to the clock φCKc and the clock φBCKt, and can realize the pull-up operation and the pull-down operation while preventing a through current in the input circuit 41 and/or the latch circuit 42.

For example, as illustrated in FIG. 2, the control signal φPD34 becomes at the Logical high level (active level) and both the pull-up switches PD3 and PD4 are turned on in response to the fact that the output of the input circuit 41 becomes at the Logical high level at the timing when both the clock φCKc and the clock φBCKt become at the Logical low level. As a result, since the node N9 and the node N10 are pulled up, the waveform of the clock φBCKout can be steeply raised and output from the output node ON2.

That is, the waveform of the clock φCKout can be steeply raised by the cross point correction circuit 30 in response to the clock φCKt and the clock φBCKc, and the waveform of the clock φBCKout can be steeply raised by the cross point correction circuit 40 in response to the clock φCKc and the clock φBCKt. Therefore, a delay in edge timing of the first differential clock can be suppressed. As a result, the cross point of the first differential clock can be brought close to the vicinity of the appropriate level (for example, the intermediate level between the Logical high level and the Logical low level), and a large eye pattern can be secured.

As described above, in the first embodiment, the pull-up circuits 33 and 43 capable of pulling up the intermediate node on the power supply side and the pull-down circuits 34 and 44 capable of pulling down the intermediate node on the ground side are provided in the cross point correction circuits 30 and 40 of the semiconductor device 1. As a result, DCD can be suppressed for the first differential clock and the first differential clock can be appropriately generated.

Second Embodiment

Next, a semiconductor device 201 according to a second embodiment will be described. Hereinafter, portions different from the first embodiment will be mainly described.

As illustrated in the first embodiment, when the deviation between the edge timing of the non-inverting-side clock and the edge timing of the inverting-side clock falls within a predetermined range (for example, within a range equal to or less than a half cycle of the reference differential clock), the cross point of the differential clocks can be brought close to the vicinity of the appropriate level by the cross point correction circuit 30 and the cross point correction circuit 40.

However, if the deviation between the edge timing of the non-inverting-side clock and the edge timing of the inverting-side clock falls outside the predetermined range, it becomes difficult to bring the cross point of the differential clocks close to the vicinity of the appropriate level.

Therefore, in the second embodiment, second-stage cross point correction by the comparison circuit is added to first-stage cross point correction by a cross point correction circuit, thereby to enable appropriate cross point correction in a case where deviation in edge timing between a non-inverting-side clock and an inverting-side clock.

Figure 3:
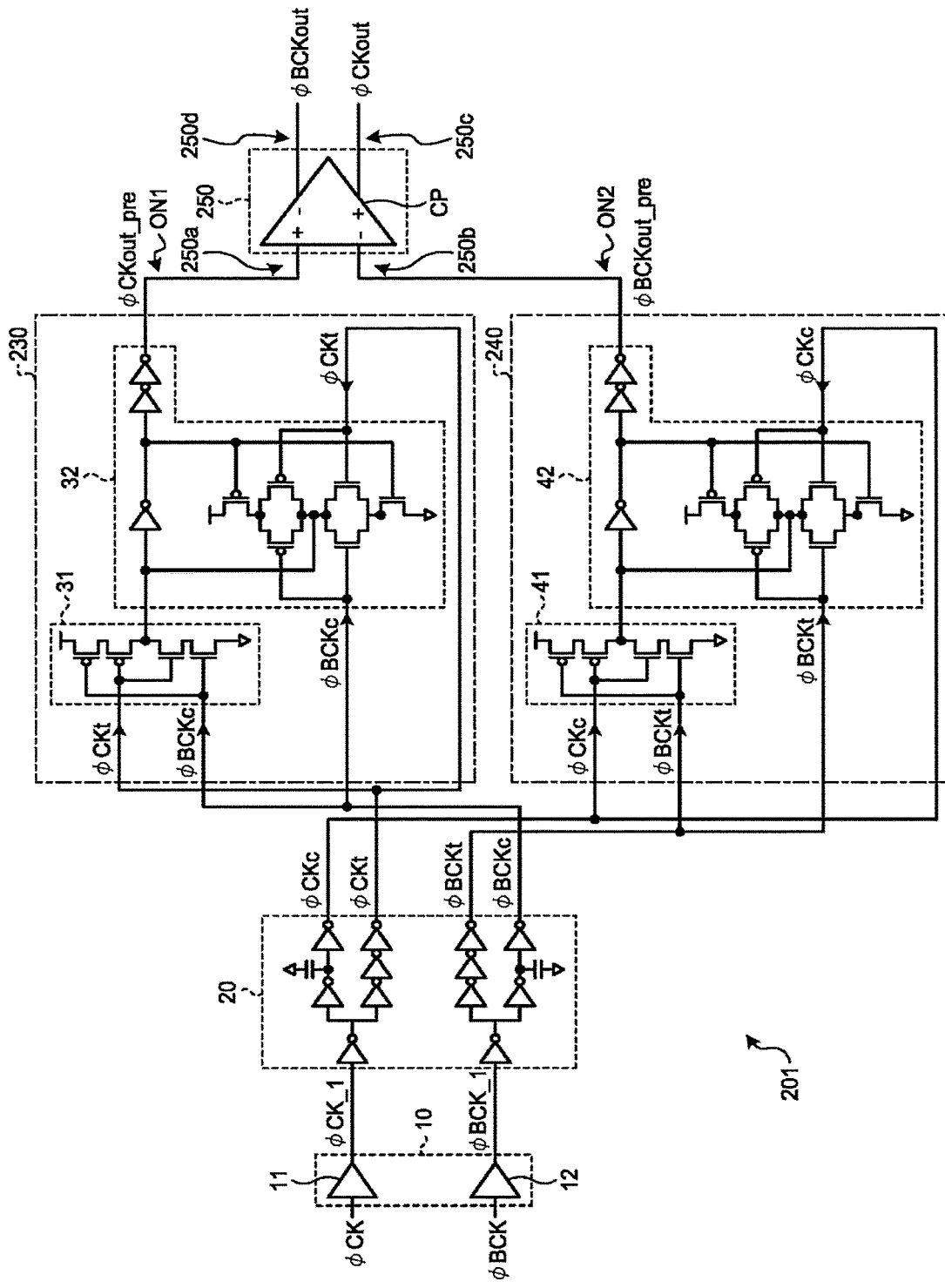
FIG. 3 is a circuit diagram illustrating a configuration of a semiconductor device according to a second embodiment.

Specifically, as illustrated in FIG. 3, the semiconductor device 201 includes a cross point correction circuit 230 and a cross point correction circuit 240 instead of the cross point correction circuit 30 and the cross point correction circuit 40 (see FIG. 1), and further includes a comparison circuit 250. FIG. 3 is a diagram illustrating a configuration of the semiconductor device 201.

The cross point correction circuit 230 is different from the cross point correction circuit 30 in not including the pull-up circuit 33, the pull-down circuit 34, and the control circuit 35 illustrated in FIG. 1. A non-inverting-side clock output from the cross point correction circuit 230 will be referred to as φCKout_pre.

The cross point correction circuit 240 is different from the cross point correction circuit 40 in not including the pull-up circuit 43, the pull-down circuit 44, and the control circuit 45 illustrated in FIG. 1. An inverting-side clock output from the cross point correction circuit 240 will be referred to as φBCKout_pre.

The comparison circuit 250 is arranged on an output side of the cross point correction circuit 230 and on an output side of the cross point correction circuit 240. The comparison circuit 250 includes an input node 250a, an input node 250b, an output node 250c, and an output node 250d. The input node 250a is connected to an output node ON1 of the cross point correction circuit 230. The input node 250b is connected to an output node ON2 of the cross point correction circuit 240. The output node 250c functions as a non-inverting-side output node of the semiconductor device 201. The output node 250d functions as an inverting-side output node of the semiconductor device 201.

The comparison circuit 250 receives the clock φCKout_pre from the cross point correction circuit 230 and receives the clock φBCKout_pre from the cross point correction circuit 240. The comparison circuit 250 compares the clock φCKout_pre with the clock φBCKout_pre and outputs a clock φCKout and a clock φBCKout with corrected cross points of the clock φCKout_pre and the clock φBCKout_pre, as a comparison result.

The comparison circuit 250 includes a comparator CP. As the comparator CP, a differential amplifier configured to prevent application of feedback between input and output (so as to perform a comparator operation) can be used. The comparator CP is electrically inserted between the input node 250a and the input node 250b, and the output node 250c and the output node 250d. The comparator CP has a non-inverting input terminal (+) electrically connected to the output node ON1 of the cross point correction circuit 230 via the input node 250a, an inverting input terminal (−) electrically connected to the output node ON2 of the cross point correction circuit 240 via the input node 250b, a non-inverting output terminal (+) electrically connected to the output node 250c, and an inverting output terminal (−) electrically connected to the output node 250d.

The comparator CP receives the clock φCKout_pre from the cross point correction circuit 230 and receives the clock φBCKout_pre from the cross point correction circuit 240. The comparator CP compares the clock φCKout_pre with the clock φBCKout_pre, outputs an Logical high level as a non-inversion comparison result (clock φCKout) and outputs an Logical low level as an inversion comparison result (clock φBCKout) when the level of the clock φCKout_pre is higher than the level of the clock φBCKout_pre. The comparator CP outputs the Logical low level as the non-inversion comparison result (clock φCKout) and outputs the Logical high level as the non-inversion comparison result (clock φBCKout) when the level of the clock φCKout_pre is lower than the level of the clock φBCKout_pre. As a result, the comparator CP outputs the clock φCKout and the clock φBCKout with the corrected cross points of the clock φCKout_pre and the clock φBCKout_pre.

Figure 4:
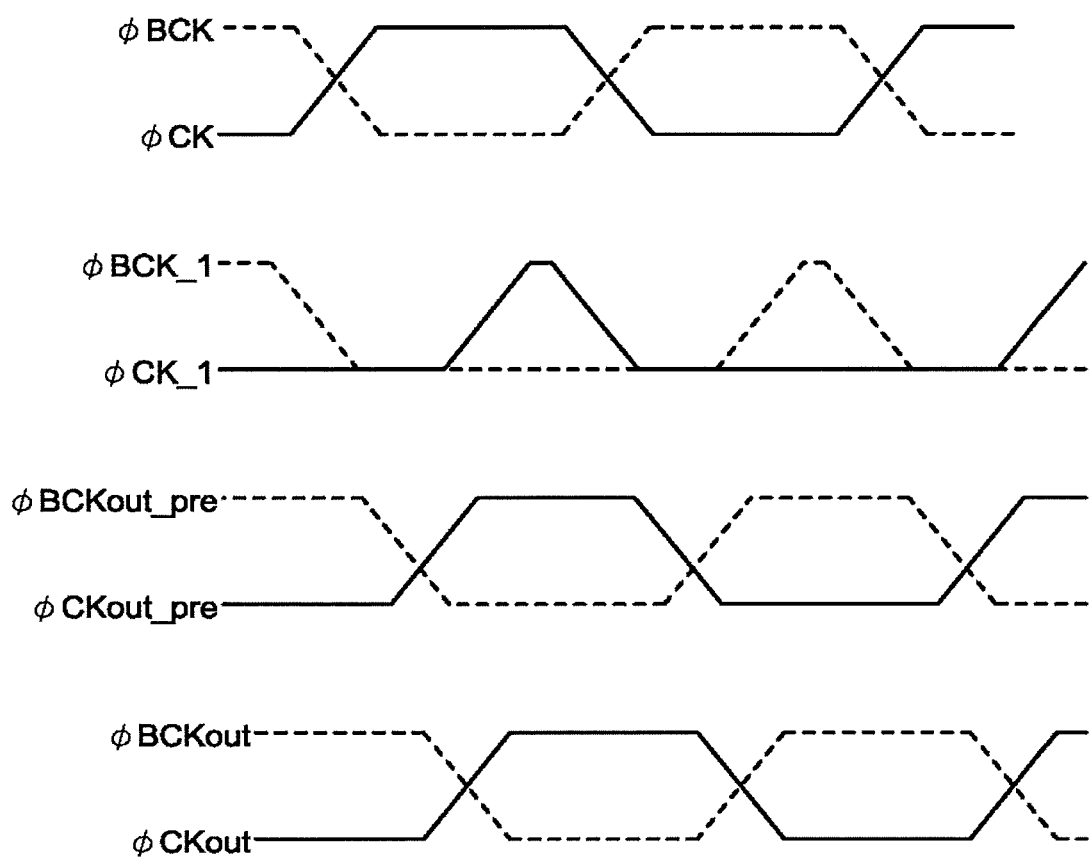
FIG. 4 is a waveform diagram illustrating an operation of the semiconductor device according to the second embodiment.

For example, in a case where asymmetry of characteristics and the like between a non-inverting-side receiver 11 and an inverting-side receiver 12 are large, deviation in edge timing of waveforms of a non-inverted clock φCK_1 and an inverted clock φBCK_1 may fall outside a predetermined range (for example, a range equal to or less than a half cycle of reference differential clocks φCK and φBCK), as illustrated by the solid line and the broken line in FIG. 4. In this case, the cross points of the clock φCKout_pre and the clock φBCKout_pre are likely to deviate from an appropriate level (for example, an intermediate level between the Logical high level and the Logical low level) as illustrated by the solid line and the broken line in FIG. 4. At this time, the comparator CP outputs the Logical high level as the clock φCKout and the Logical low level as the clock φBCKout when the level of the clock φCKout_pre is higher than the level of the clock φBCKout_pre, and outputs the Logical low level as the clock φCKout and the Logical high level as the clock φBCKout when the level of the clock φCKout_pre is lower than the level of the clock φBCKout_pre. As a result, the comparator CP can generate the clock φCKout and the clock φBCKout with the cross points at the appropriate level (for example, at the intermediate level).

As described above, in the second embodiment, the second-stage cross point correction by the comparison circuit 250 is added to the first-stage cross point correction by the cross point correction circuits 230 and 240 in the semiconductor device 201. As a result, the cross point correction can be appropriately performed in the case where the deviation in the edge timing between the non-inverting-side clock and the inverting-side clock is large.

Figure 5:
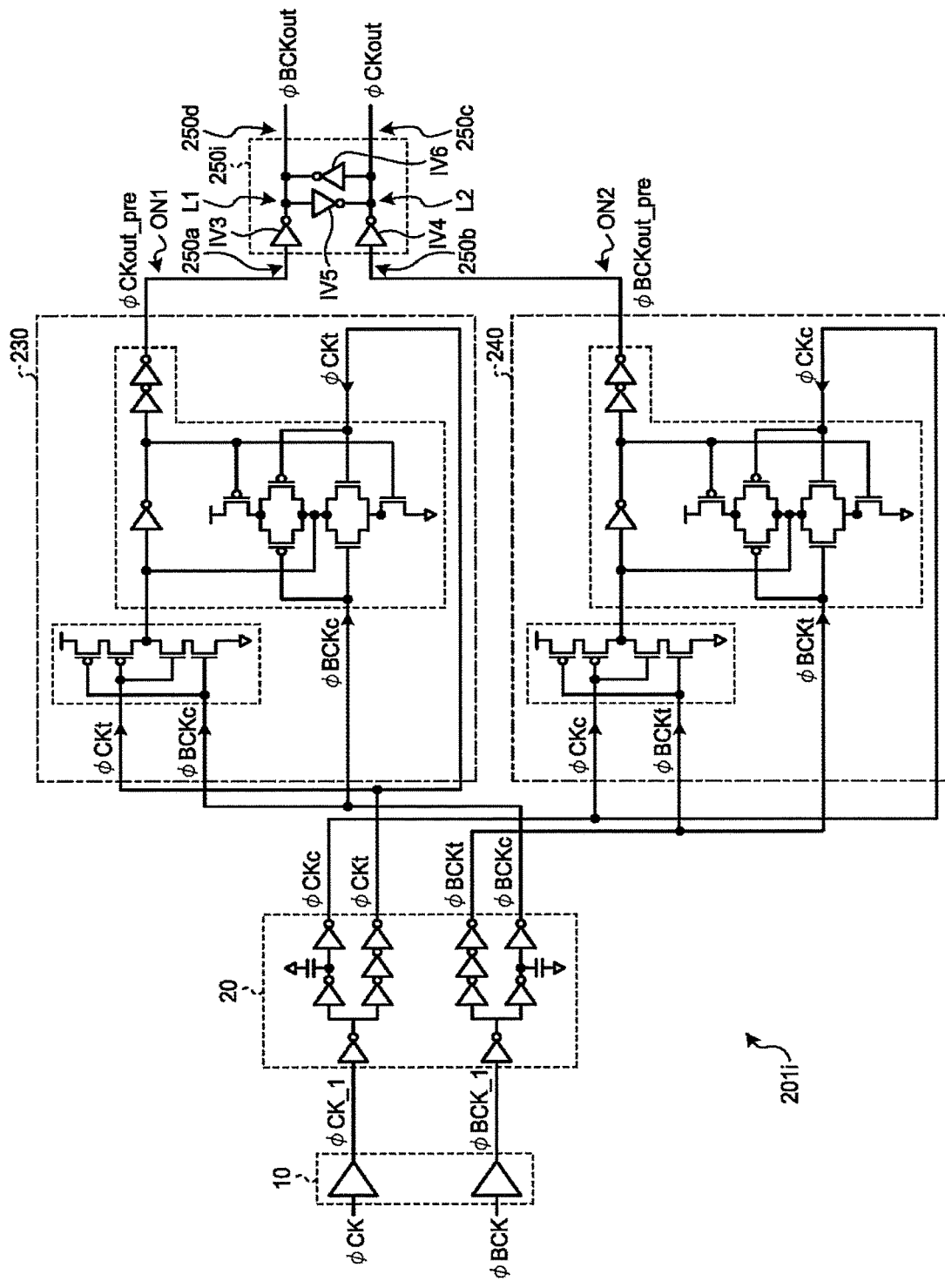
FIG. 5 is a circuit diagram illustrating a configuration of a semiconductor device according to a modification of the second embodiment.

Note that, as illustrated in FIG. 5, measures to reduce power consumption in a semiconductor device 201i may be added. In the semiconductor device 201i, a comparison circuit 250i may be configured using a plurality of inverters having a "back to back" configuration in place of the comparator CP (differential amplifier) illustrated in FIG. 3. FIG. 5 is a circuit diagram illustrating the configuration of the semiconductor device 201i according to a modification of the second embodiment.

The comparison circuit 250i includes a plurality of inverters IV3, IV4, IV5, and IV6. The inverter IV4 has an input node electrically connected to the output node ON2 of the cross point correction circuit 240 via input node 250b and an output node electrically connected to a line L2. The line L2 is arranged on an output side of the inverter IV4. The line L2 electrically connects the output node of the inverter IV4 and the output node 250c of the comparison circuit 250i. The clock φCKout can be output from the comparison circuit 250i to the output node 250c.

The inverter IV3 has an input node electrically connected to the output node ON1 of the cross point correction circuit 230 via the input node 250a and an output node electrically connected to a line L1. The line L1 is arranged on an output side of the inverter IV3. The line L1 electrically connects the output node of the inverter IV3 and the output node 250d of comparison circuit 250i. The clock φBCKout can be output from the comparison circuit 250i to the output node 250d.

The inverter IV5 is electrically inserted with a first polarity between the line L1 and the line L2. The first polarity can be a polarity with which the input node of the inverter IV5 is electrically connected to the line L1 and the output node of the inverter IV5 is electrically connected to the line L2, for example.

The inverter IV6 is electrically inserted with a second polarity between the line L1 and the line L2. The second polarity is a polarity opposite to the first polarity, and can be a polarity with which the output node of the inverter IV6 is electrically connected to the line L1 and the input node of the inverter IV6 is electrically connected to the line L2, for example.

As described above, in the semiconductor device 201i, the comparison circuit 250i is configured using the plurality of inverters having the "back to back" configuration. Accordingly, a configuration having relatively large power consumption (for example, a current source in a differential amplifier) can be omitted, and the power consumption of the semiconductor device 201i can be easily reduced.

Figure 6:
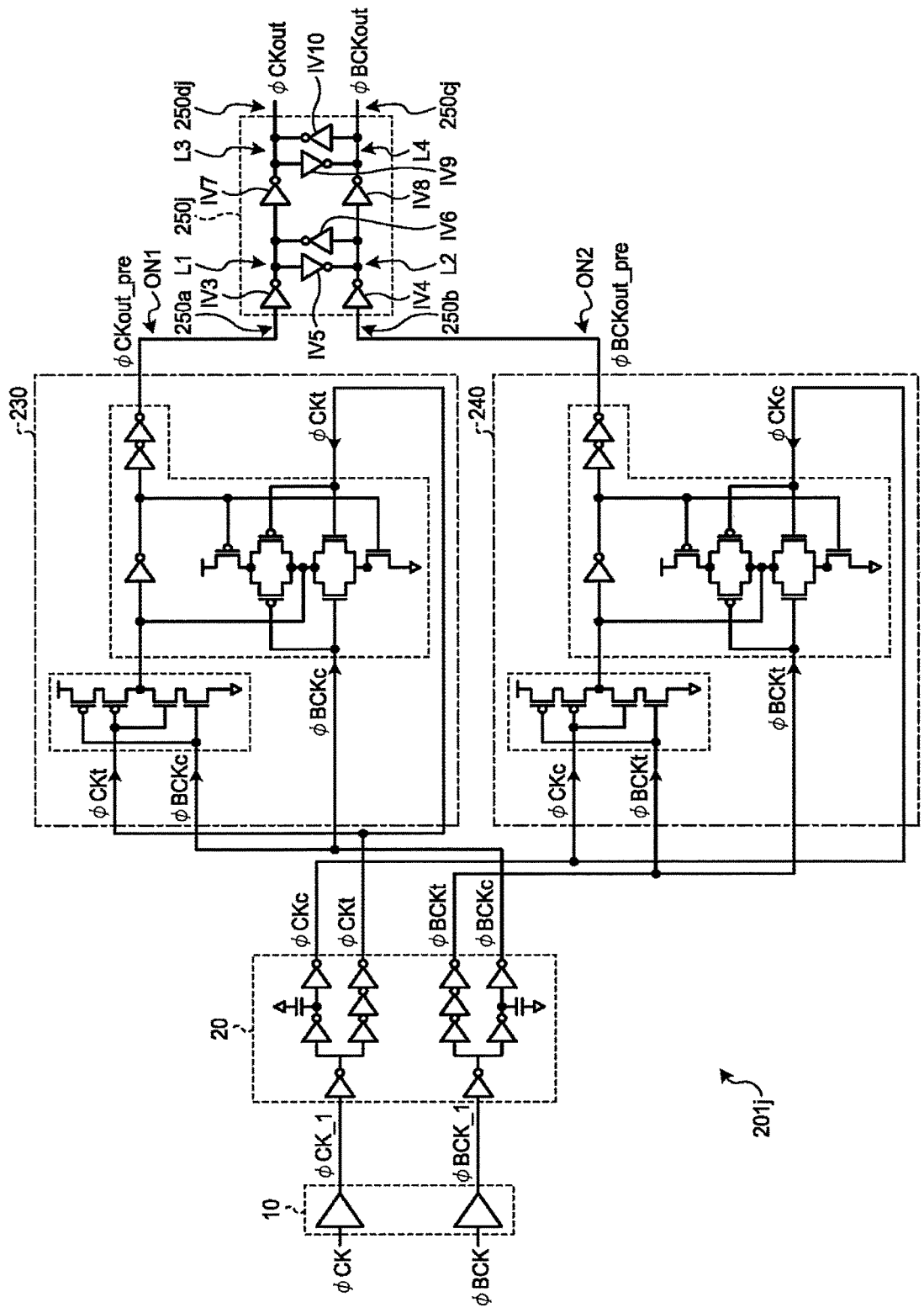
FIG. 6 is a circuit diagram illustrating a configuration of a semiconductor device according to another modification of the second embodiment.

Alternatively, as illustrated in FIG. 6, measures to enhance accuracy of adjustment of a duty ratio in a semiconductor device 201j may be added. In the semiconductor device 201j, a comparison circuit 250j may be configured using a plurality of inverters having a "back to back" configuration in two stages in place of the comparator CP (differential amplifier) illustrated in FIG. 3. FIG. 6 is a circuit diagram illustrating a configuration of the semiconductor device 201j according to another modification of the second embodiment.

The comparison circuit 250j further includes a plurality of inverters IV7, IV8, IV9, and IV10 for the comparison circuit 250i (see FIG. 5). The inverter IV7 has an input node electrically connected to the output node of the inverter IV3 via the line L1 and an output node electrically connected to a line L3. The line L3 is arranged on an output side of the inverter IV7. The line L3 electrically connects the output node of the inverter IV7 and an output node 250dj of the comparison circuit 250j. The clock φCKout can be output from the comparison circuit 250j to the output node 250dj.

The inverter IV8 has an input node electrically connected to the output node of the inverter IV4 via the line L2 and an output node electrically connected to a line L4. The line L4 is arranged on an output side of the inverter IV8. The line L4 electrically connects the output node of the inverter IV8 and an output node 250cj of the comparison circuit 250j. The clock φBCKout can be output from the comparison circuit 250j to the output node 250cj.

The inverter IV9 is electrically inserted with a first polarity between the line L3 and the line L4. The first polarity can be a polarity with which the input node of the inverter IV9 is electrically connected to the line L3 and the output node of the inverter IV9 is electrically connected to the line L4, for example.

The inverter IV10 is electrically inserted with a second polarity between the line L3 and the line L4. The second polarity is a polarity opposite to the first polarity, and can be a polarity with which the output node of the inverter IV10 is electrically connected to the line L3 and the input node of the inverter IV10 is electrically connected to the line L4, for example.

As described above, in the semiconductor device 201j, the comparison circuit 250j is configured using the plurality of inverters that realize the "back to back" configuration in two stages. With the configuration, the accuracy of the comparison operation in the comparison circuit 250j can be improved. Therefore, the cross points of the clock φCKout and the clock φBCKout after generation can be easily brought close to the vicinity of the appropriate level (for example, the intermediate level), and the cross points of the differential clocks can be corrected with high accuracy.

Third Embodiment

Next, a semiconductor device 301 according to a third embodiment will be described. Hereinafter, portions different from the first and second embodiments will be mainly described.

In the third embodiment, the measure in the first embodiment and the measure in the second embodiment are combined.

Figure 7:
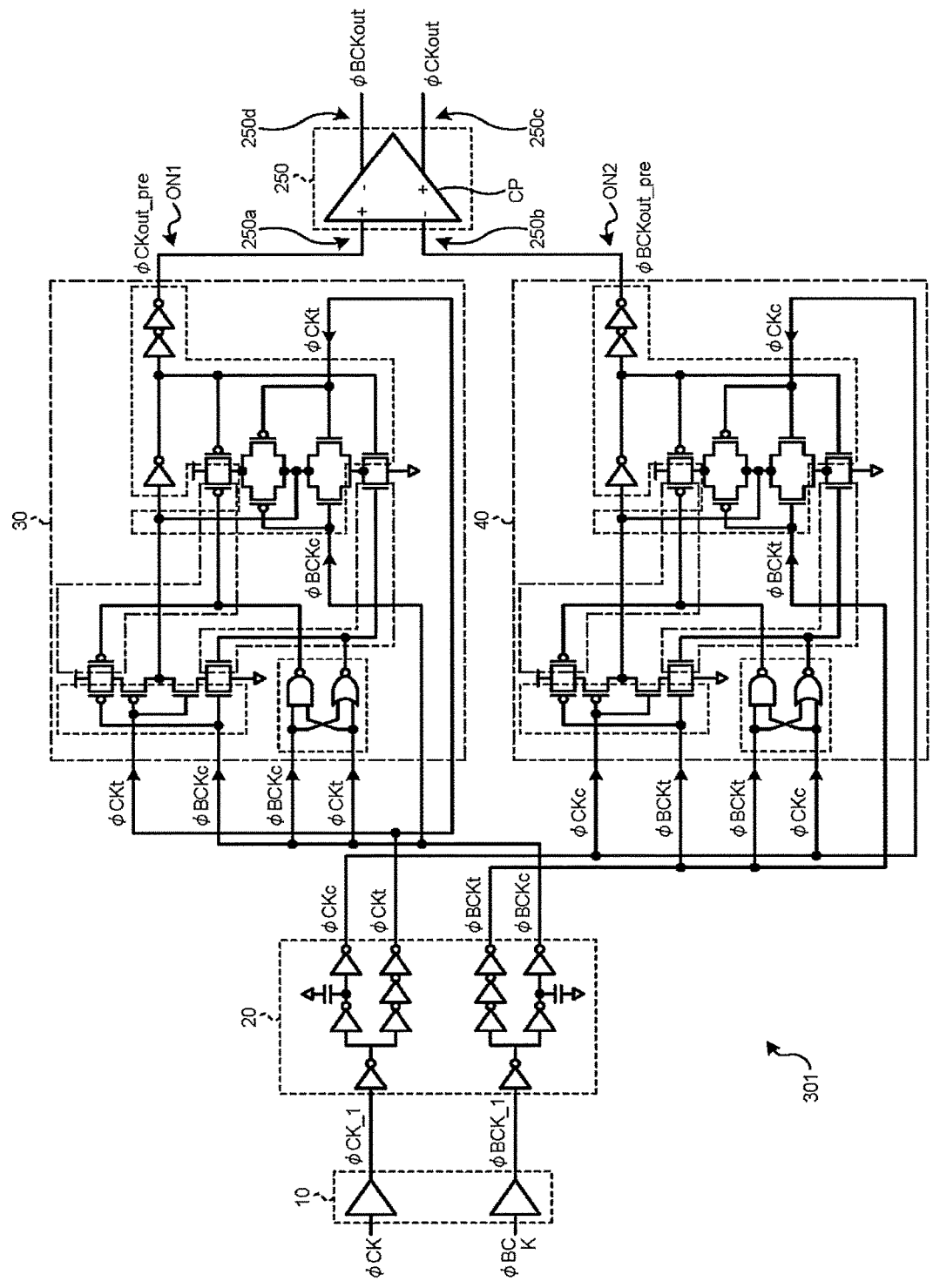
FIG. 7 is a circuit diagram illustrating a configuration of a semiconductor device according to a third embodiment.

Specifically, the semiconductor device 301 further includes a comparison circuit 250 (see FIG. 3) in addition to a receiver 10, a phase splitter 20, a cross point correction circuit 30, and a cross point correction circuit 40 (see FIG. 1), as illustrated in FIG. 7. FIG. 7 is a diagram illustrating a configuration of the semiconductor device 301.

A non-inverting-side clock output from the cross point correction circuit 30 will be referred to as φCKout_pre. An inverting-side clock output from the cross point correction circuit 40 will be referred to as φBCKout_pre. The comparison circuit 250 is arranged on an output side of the cross point correction circuit 30 and on an output side of the cross point correction circuit 40. The input node 250a is connected to an output node ON1 of the cross point correction circuit 30. The input node 250b is connected to an output node ON2 of the cross point correction circuit 40.

The comparison circuit 250 receives the clock φCKout_pre from the cross point correction circuit 30 and receives the clock φBCKout_pre from the cross point correction circuit 40. The comparison circuit 250 compares the clock φCKout_pre with the clock φBCKout_pre and outputs a clock φCKout and a clock φBCKout with corrected cross points of the clock φCKout_pre and the clock φBCKout_pre, as a comparison result. Details of the comparison circuit 250 are similar to those of the second embodiment.

As described above, in the third embodiment, pull-up circuits 33 and 43 capable of pulling up an intermediate node on a power supply side and pull-down circuits 34 and 44 capable of pulling down an intermediate node on a ground side are provided in the cross point correction circuits 30 and 40 of the semiconductor device 301. As a result, DCD can be suppressed for the first differential clock and the first differential clock can be appropriately generated.

Further, in the third embodiment, the second-stage cross point correction by the comparison circuit 250 is added to the first-stage cross point correction by the cross point correction circuits 30 and 40 in the semiconductor device 301. As a result, the cross point correction can be appropriately performed in the case where the deviation in the edge timing between the non-inverting-side clock and the inverting-side clock is large.

Figure 8:
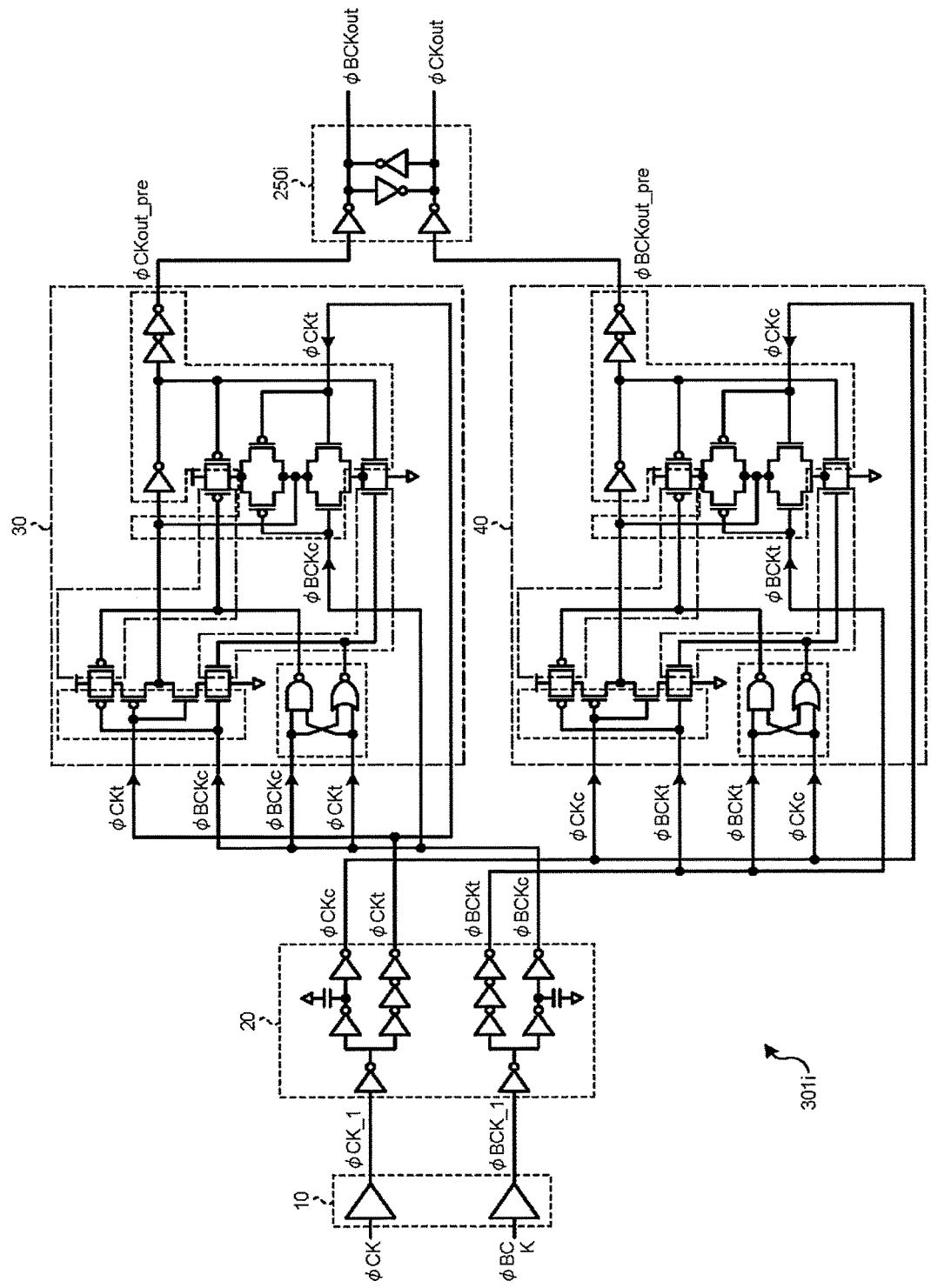
FIG. 8 is a circuit diagram illustrating a configuration of a semiconductor device according to a modification of the third embodiment.

Note that, as illustrated in FIG. 8, measures to reduce power consumption in a semiconductor device 301i may be added. In the semiconductor device 301i, a comparison circuit 250i may be configured using a plurality of inverters having the "back to back" configuration illustrated in FIG. 5 in place of the comparator CP (differential amplifier) illustrated in FIG. 3. FIG. 8 is a circuit diagram illustrating a configuration of the semiconductor device 301i according to a modification of the third embodiment. For details of the comparison circuit 250i, the description given with reference to FIG. 5 can be applied.

Figure 9:
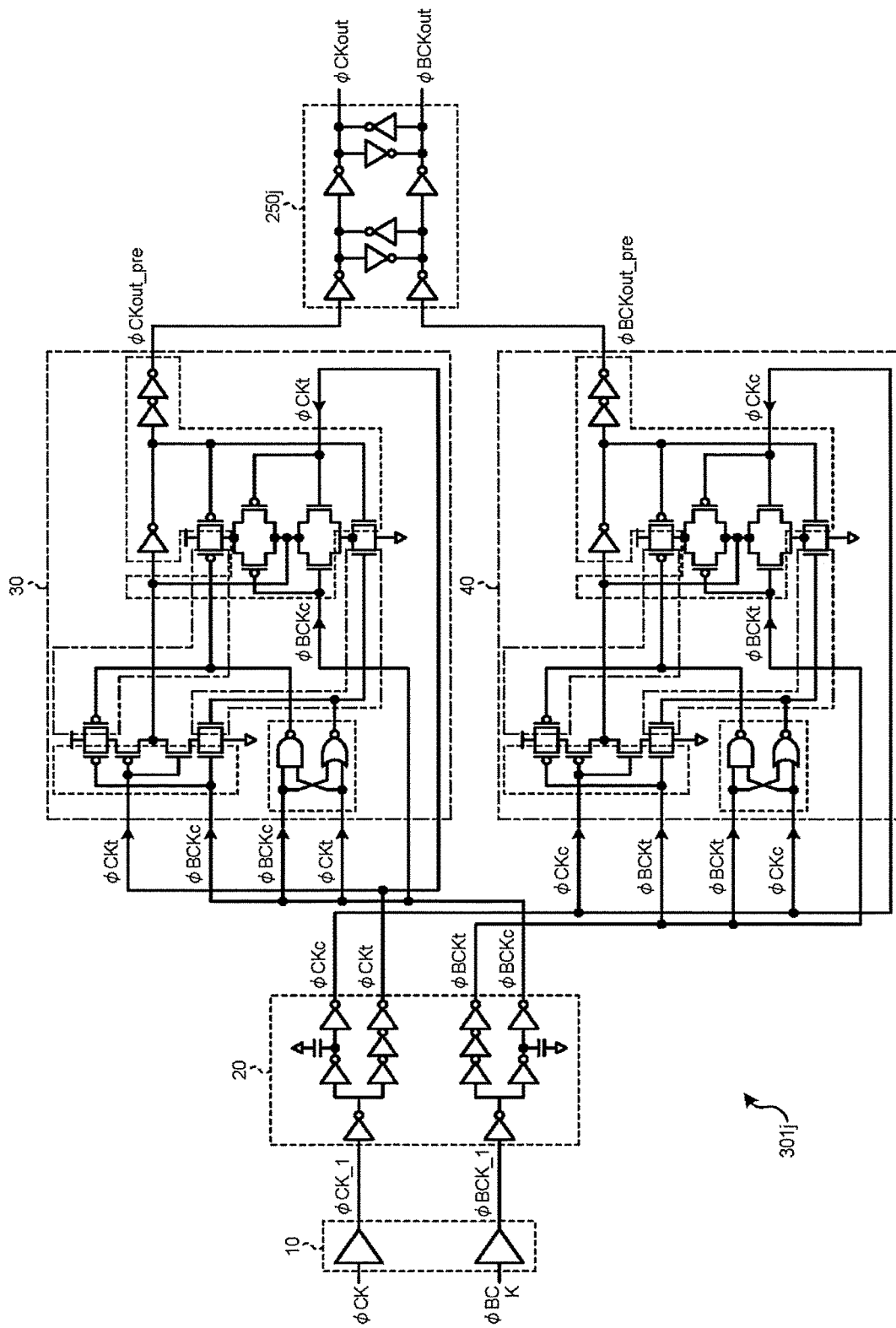
FIG. 9 is a circuit diagram illustrating a configuration of a semiconductor device according to another modification of the third embodiment.

Alternatively, as illustrated in FIG. 9, measures to improve accuracy of adjustment of a duty ratio in the semiconductor device 301j may be added. In the semiconductor device 301j, a comparison circuit 250j may be configured using a plurality of inverters having the "back to back" configuration illustrated in FIG. 6 in two stages in place of the comparator CP (differential amplifier) illustrated in FIG. 3. FIG. 9 is a circuit diagram illustrating a configuration of the semiconductor device 301j according to another modification of the third embodiment. For details of the comparison circuit 250j, the description given with reference to FIG. 6 can be applied.

Figure 10:
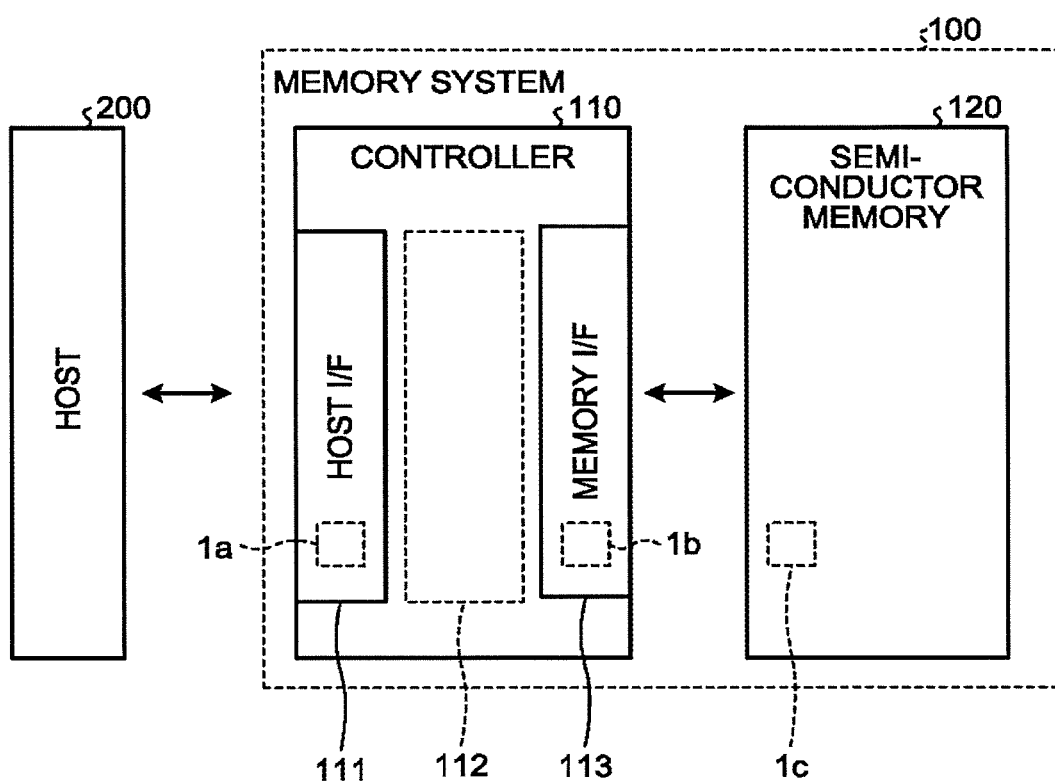
FIG. 10 is a diagram illustrating a configuration of a memory system to which the semiconductor devices according to the first to third embodiments and the modifications are applied.

Next, a memory system 100 to which the semiconductor devices according to the first to third embodiments and the modifications are applied will be described with reference to FIG. 10. FIG. 10 is a diagram illustrating a configuration of a memory system to which the semiconductor devices according to the first to third embodiments and the modifications are applied.

A memory system 100 can be connected to a host 200 and can function as an external storage medium of the host 200. The host 200 is, for example, a personal computer, and the memory system 100 is, for example, an SSD. The memory system 100 includes a controller 110 and a semiconductor memory 120. The controller 110 is a circuit as hardware, and includes a host interface circuit (host I/F) 111, a signal processing circuit 112, and a memory interface circuit (memory I/F) 113.

For example, the host I/F 111 includes a semiconductor device 1a. The semiconductor device 1a can be applied to any of the semiconductor devices according to the first to third embodiments and the modifications. The host I/F 111 receives a predetermined signal from the host 200. The host I/F 111 generates reference differential clocks φCK and φBCK from the predetermined signal and transfers the reference differential clocks to the semiconductor device 1a. The semiconductor device 1a receives the reference differential clocks φCK and φBCK, generates internal differential clocks φCKout and φBCKout, using the reference clocks φCK and φBCK, and supplies the internal differential clocks φCKout and φBCKout to the signal processing circuit 112. As a result, the internal differential clocks φCKout and φBCKout can be appropriately used in the signal processing circuit 112, the memory I/F 113, or the semiconductor memory 120.

The memory I/F 113 includes a semiconductor device 1b. The semiconductor device 1b can be applied to any of the semiconductor devices according to the first to third embodiments and the modifications. The memory I/F 113 receives a predetermined signal from the signal processing circuit 112. The memory I/F 113 generates the reference differential clocks φCK and φBCK from the predetermined signal and transfers the reference differential clocks φCK and φBCK to the semiconductor device 1b. The semiconductor device 1b receives the reference differential clocks φCK and φBCK, generates the internal differential clocks φCKout and φBCKout, using the reference differential clocks φCK and φBCK, and uses or supplies the internal differential clocks φCKout and φBCKout to the semiconductor memory 120. As a result, the internal differential clocks φCKout and φBCKout can be appropriately used in the memory I/F 113 or the semiconductor memory 120.

The semiconductor memory 120 includes a semiconductor device 1c. The semiconductor device 1c can be applied to any of the semiconductor devices according to the first to third embodiments and the modifications. The memory I/F 113 receives a predetermined signal from the signal processing circuit 112. The memory I/F 113 generates the reference differential clocks φCK and φBCK from the predetermined signal and supplies the reference differential clocks φCK and φBCK to the semiconductor memory 120. The semiconductor memory 120 transfers the supplied reference differential clocks φCK and φBCK to the semiconductor device 1c. The semiconductor device 1c receives the reference differential clocks φCK and φBCK, generates the internal differential clocks φCKout and φBCKout, using the reference differential clocks φCK and φBCK, and uses or supplies the internal differential clocks φCKout and φBCKout to another circuit of the semiconductor memory 120. As a result, the internal differential clocks φCKout and φBCKout can be appropriately used in the semiconductor memory 120.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first input circuit in which, between a first transistor with the first conductivity type and a first transistor with the second conductivity type, a second transistor with a first conductivity type and a second transistor with a second conductivity type are arranged, the second transistor with the first conductivity type and the second transistor with the second conductivity type having gates commonly connected to a second input node, the first transistor with the first conductivity type and the first transistor with the second conductivity type having gates commonly connected to a first input node;
a first latch circuit in which a connection of a fourth transistor with the first conductivity type and a fourth transistor with the second conductivity type and a connection of a fifth transistor with the first conductivity type and a fifth transistor with the second conductivity type are arranged in parallel between a third transistor with the first conductivity type and a third transistor with the second conductivity type, the fourth transistor with the first conductivity type and the fourth transistor with the second conductivity type having gates commonly connected to the first input node and having drains commonly connected to a first node, the fifth transistor with the first conductivity type and the fifth transistor with the second conductivity type having gates commonly connected to the second input node and having drains commonly connected to the first node, the third transistor with the first conductivity type and the third transistor with the second conductivity type having gates commonly connected to a second node connected to the first node on an output side of the first input circuit via a first inverter;
a second input circuit in which a seventh transistor with the first conductivity type and a seventh transistor with the second conductivity type are arranged between a sixth transistor with the first conductivity type and a sixth transistor with the second conductivity type, the seventh transistor with the first conductivity type and the seventh transistor with the second conductivity type having gates commonly connected to a fourth input node, the sixth transistor with the first conductivity type and the sixth transistor with the second conductivity type having gates commonly connected to a third input node;

a second latch circuit in which a connection of a ninth transistor with the first conductivity type and a ninth transistor with the second conductivity type and a connection of a tenth transistor with the first conductivity type and a tenth transistor with the second conductivity type are arranged in parallel between an eighth transistor with the first conductivity type and an eighth transistor with the second conductivity type, the ninth transistor with the first conductivity type and the ninth transistor with the second conductivity type having gates commonly connected to the third input node and having drains commonly connected to a third node, the tenth transistor with the first conductivity type and the tenth transistor with the second conductivity type having gates commonly connected to the fourth input node and having drains commonly connected to the third node, the eighth transistor with the first conductivity type and the eighth transistor with the second conductivity type having gates commonly connected to a fourth node connected to the third node on an output side of the second input circuit via a second inverter; and a comparison circuit connected to an output node of the first latch circuit and an output node of the second latch circuit.

2. The semiconductor device according to claim 1, wherein the comparison circuit includes a comparator including a non-inverting input terminal connected to the output node of the first latch circuit and an inverting input terminal connected to the output node of the second latch circuit.

3. The semiconductor device according to claim 1, wherein the comparison circuit includes
a third inverter connected to the output node of the first latch circuit,
a fourth inverter connected to the output node of the second latch circuit,
a fifth inverter electrically inserted with a first polarity between a first line arranged on an output side of the third inverter and a second line arranged on an output side of the fourth inverter, and
a sixth inverter electrically inserted with a second polarity opposite to the first polarity between the first line and the second line.

4. The semiconductor device according to claim 3, wherein the comparison circuit includes
a seventh inverter electrically connected to the first line,
an eighth inverter electrically connected to the second line,
a ninth inverter electrically inserted with the first polarity between a third line arranged on an output side of the seventh inverter and a fourth line arranged on an output side of the eighth inverter, and
a tenth inverter electrically inserted with the second polarity between the third line and the fourth line.

5. A memory system comprising:
the semiconductor device according to claim 1 that generates a differential clock; and
a semiconductor memory that operates using the generated differential clock.

* * * * *